United States Patent
Frey et al.

(10) Patent No.: US 7,301,798 B2
(45) Date of Patent: Nov. 27, 2007

(54) RANDOM ACCESS MEMORY CELL OF REDUCED SIZE AND COMPLEXITY

(75) Inventors: Christophe Frey, Austin, TX (US); David Turgis, La Touvet (FR); Jean-Christophe Lafont, Meylan (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 11/155,012

(22) Filed: Jun. 16, 2005

(65) Prior Publication Data

US 2006/0002191 A1 Jan. 5, 2006

(30) Foreign Application Priority Data

Jun. 17, 2004 (FR) .................................. 04 06600

(51) Int. Cl.
*G11C 11/00* (2006.01)
(52) U.S. Cl. ............. 365/154; 365/189.01; 365/189.02
(58) Field of Classification Search ................ 365/154, 365/189.01, 189.04
See application file for complete search history.

(56) References Cited

U.S. PATENT DOCUMENTS

| | | | | |
|---|---|---|---|---|
| 5,473,574 A | * | 12/1995 | Clemen et al. | ........ 365/230.05 |
| 5,475,644 A | * | 12/1995 | Chauvel et al. | ............. 365/221 |
| 5,590,087 A | * | 12/1996 | Chung et al. | .......... 365/230.05 |
| 5,901,079 A | * | 5/1999 | Chiu et al. | ................... 365/154 |
| 6,288,969 B1 | * | 9/2001 | Gibbins et al. | ........ 365/230.05 |
| 6,307,793 B1 | * | 10/2001 | Murakami | ............. 365/189.11 |
| 6,519,204 B2 | * | 2/2003 | Slamowitz et al. | .... 365/230.05 |
| 2001/0017793 A1 | * | 8/2001 | Sample et al. | ......... 365/189.08 |
| 2004/0066687 A1 | | 4/2004 | Slamowitz et al. | |
| 2004/0125683 A1 | * | 7/2004 | Iwahashi et al. | ....... 365/230.05 |

FOREIGN PATENT DOCUMENTS

EP 1 204 121 5/2002

OTHER PUBLICATIONS

M. Izumikawa, "A Current Direction Sense Technique for Multiport SRAM's", IEICE Transactions on Electronics, vol. E79-C, No. 7, Jul. 1996, pp. 957-962, XP000632350.
French Preliminary Search Report dated Mar. 1, 2005 for French Application No. 04 06600.

* cited by examiner

*Primary Examiner*—Thong Q. Le
(74) *Attorney, Agent, or Firm*—Lisa K. Jorgenson; Jose Gutman; Fleit Kain Gibbons Gutman Bongini & Bianco P.L.

(57) ABSTRACT

A memory cell (1), includes a flip-flop (2) that has additional read/write terminals; a 1-bit write line (wb11); a first transistor (T4) switching between the 1-bit write line and the terminal, its gate being connected to a word selection line (W11); a 0-bit write line (wb10); a second transistor (T3) switching between the 0-bit write line and the terminal, its gate being connected to a word selection line (W12); a bit read line (b1r); and read transistors (T1, T2), with one of their gates being connected to a read/write terminal and the other being connected to a word selection line.

12 Claims, 3 Drawing Sheets

RANDOM ACCESS MEMORY CELL OF REDUCED SIZE AND COMPLEXITY

CROSS-REFERENCE TO RELATED APPLICATION

This application is based upon and claims priority from prior French Patent Application No. 04 06600 filed on Jun. 17, 2004, the entire disclosure of which is herein incorporated by reference.

BACKGROUND OF THE INVENTION

1. Field of the Invention

The invention relates in a general way to random access memories, and in particular to the structure of high-speed random access memory cells.

2. Description of the Related Art

The publication The Techniques of the Engineer describes in article E 2432 on page 24 an example of a 6-transistor SRAM memory cell. This memory cell includes a flip-flop. This flip-flop, as shown in FIG. 5, consists of two storage nodes and has read-write terminals Q and $\overline{Q}$. Each storage node consists of an nMos transistor and a pMos transistor. The nMos transistors are driver transistors Tcom1 and Tcom2 and the pMos transistors are load transistors Tc1 and Tc2. The terminals Q and $\overline{Q}$ of the flip-flop are connected to a 1-bit line and to a 0-bit line respectively through respective switching transistors. The gates of these switching transistors are connected to one and the same word selection line. These transistors act as a read-write switch in the flip-flop.

In order to obtain sufficiently high read-write speeds, driver transistors are used that have a substantial gate width. In order for the cell to have sufficient stability, the width of the gate of the switching transistors must be increased proportionately to the width of the gate of the driver transistors. Thus, a cell of this kind requires a significant substrate surface area in order to be both high-speed and stable. Moreover, the width of gate used makes it necessary to equip the circuit with a read signal amplifier so as to obtain a sufficient read current. A matrix using such cells additionally requires significant multiplexing means.

Accordingly, there exists a need for overcoming the disadvantages of the prior art as discussed above.

SUMMARY OF THE INVENTION

The invention therefore aims to resolve one or more of these drawbacks. The invention thus relates to a memory bit cell which includes:
- a flip-flop that has first and second additional read-write terminals;
- a 1-bit write line;
- a first switching transistor connected between the 1-bit write line and the first terminal (Q) and the gate of which is connected to a word selection line;
- a 0-bit write line;
- a second switching transistor connected between the 0-bit write line and the second terminal ($\overline{Q}$) and the gate of which is connected to a word selection line;
- a bit read line; and
- first and second read transistors connected in series between ground and the bit read line, the gate of the first read transistor being connected to one of the read/write terminals, the gate of the second read transistor being connected to a word selection line.

According to one variant, the flip-flop includes:
- first and second driver transistors connected between ground and the first and second terminals (Q and $\overline{Q}$) respectively and the gates of which are connected to the second and first terminals (Q and $\overline{Q}$) respectively;
- and first and second load transistors connected between the first and second terminals (Q and $\overline{Q}$) respectively and a power supply, and the gates of which are connected to the second and first terminals (Q and $\overline{Q}$) respectively. The first and second load transistors are for example of the pMos type and the first and second driver transistors are then of the nMos type.

According to another variant, the gates of the switching transistors are connected to one and the same word selection line in write mode, and the gate of the second read transistor is connected to a word selection line in a different read mode.

According to one variant, the gates of the switching transistors are connected to different word selection lines, and one of the read transistors and the switching transistor connected to the same read/write terminal have their gate connected to one and the same word selection line.

The invention further relates to a memory matrix that includes:
- first and second memory bit cells defined in the previous paragraph and sharing one and the same bit read line;
- a first word selection line connected to the gate of the first switching transistor of the first cell and to the gate of the second read transistor of the second cell;
- a second word selection line connected to the gate of the first switching transistor of the second cell and to the gate of the second read transistor of the first cell.

According to one variant, the matrix includes a driver circuit, simultaneously applying a switch-on signal to the first and second word selection lines during a write stage in the cells, applying a switch-on signal to only one of the two word selection lines during a cell read stage.

According to a further variant, the driver circuit applies write signals to the bit write lines during a write stage and does not apply write signals to the bit write lines during a read stage.

According to another variant, the driver circuit implements either a read stage of the first cell or of the second cell.

According to yet another variant, the bit read line is not connected to a measurement amplifier.

BRIEF DESCRIPTION OF THE DRAWINGS

Other advantages of the invention will emerge clearly from the description which is given hereinafter, purely by way of description and in no way limiting, with reference to the appended drawings wherein.

DETAILED DESCRIPTION

The invention proposes a memory cell fitted with a flip-flop that has additional read/write terminals. This memory cell uses two read transistors connected between a bit line and ground. The gate of one of these transistors is connected to a word selection line and the gate of the other transistor is connected to a read/write terminal of the flip flop.

Figure 1:
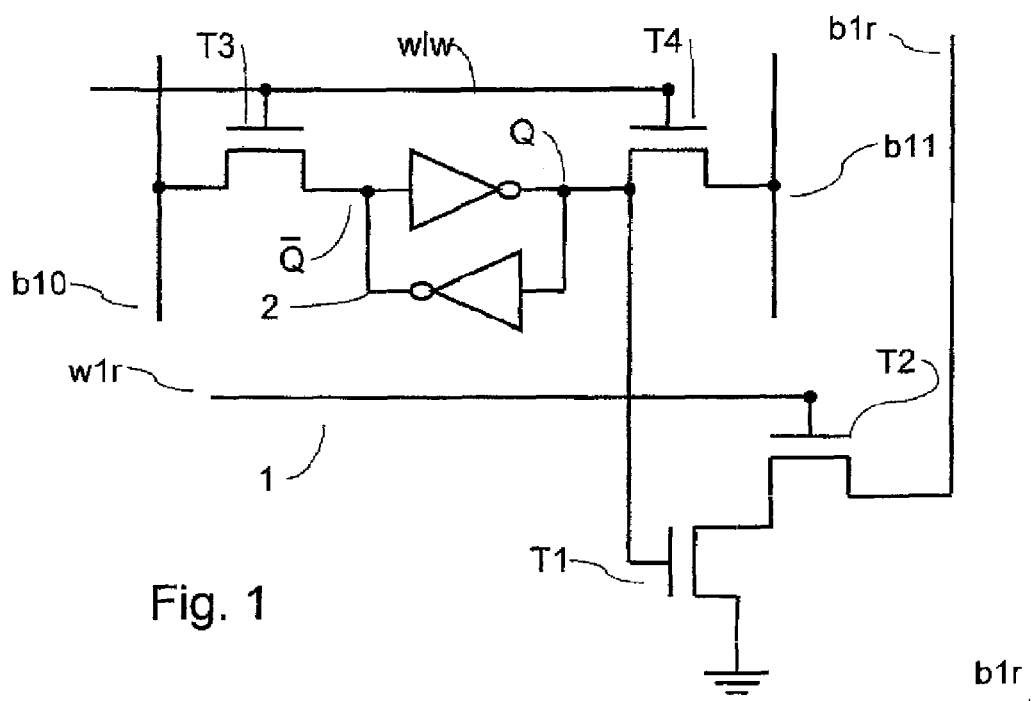
FIG. 1 is a view of a first memory cell variant.
Figure 2:
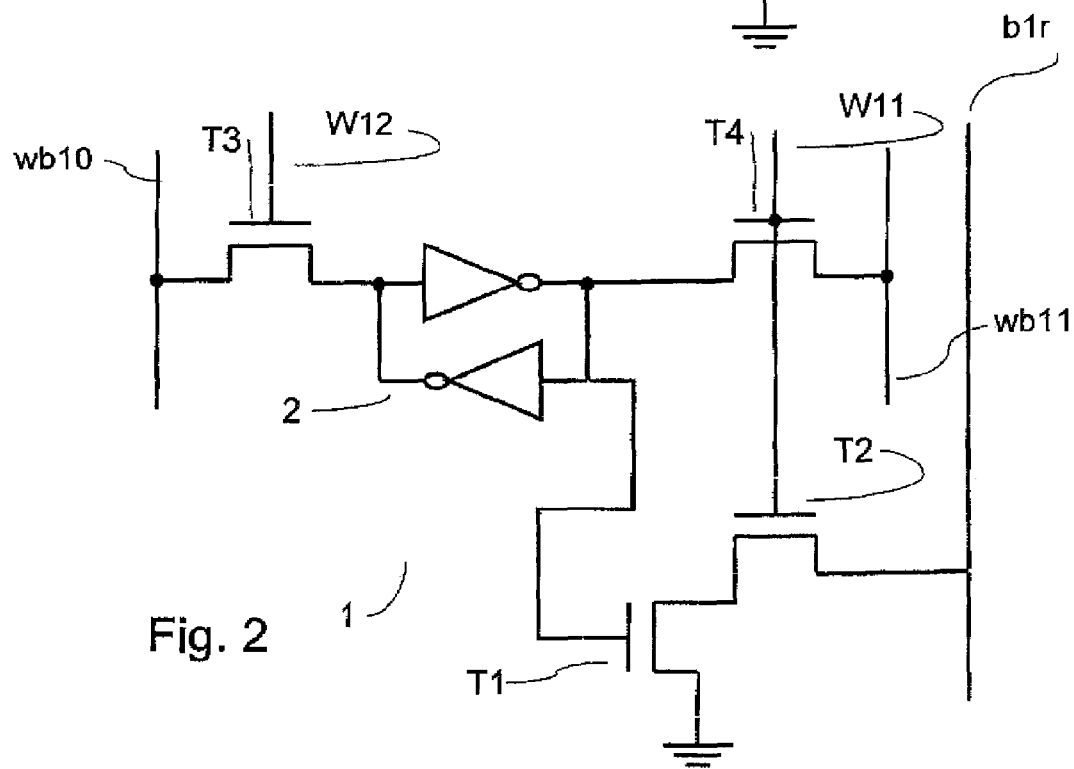
FIG. 2 is a view of a second memory cell variant.

Examples of such memory cells are shown in FIGS. 1 and 2.

FIG. 1 shows a first variant of the invention. The memory bit cell 1 includes a flip-flop 2 with two additional read/write terminals Q and $\overline{Q}$. The flip-flop 2 may particularly have the structure shown in FIG. 5. The cell 1 has a 0-bit write line b10 and a 1-bit write line b11. The line b10 is connected to the terminal $\overline{Q}$ through the switching transistor T3. Similarly, the line b11 is connected to the terminal Q through the switching transistor T4. Their drain is connected to the line b1O and to the line b11 respectively. The switching transistors T3 and T4 have their gate connected to a word selection line in write mode w1w. Read transistors T1 and T2 are connected in series. The source of T1 is grounded, the drain of T2 is connected to a bit read line b1r. The gate of T2 is connected to a word selection line in read mode wlr. The gate of T1 is connected to the terminal Q. Transistors T1 and T2 of the nMos type will preferably be used.

Depending on the logic state of the terminal Q, the transistor T1 is put into the on-state or the off-state. The level of voltage on the drain of T1 is therefore representative of the state of the terminal Q. When wlr applies a read signal to the gate of T2, T2 is put into the on-state. A voltage representing the logic level of the terminal Q is then applied to the line b1r.

Switching transistors T3 and T4 can therefore be used which have a smaller gate size. The substrate surface area occupied by the memory cell can thus be reduced or the read current can be greatly increased for a given substrate surface area. In this case, it will be possible to advantage to do without a measurement amplifier on the bit read line b1r. It will consequently be possible also to eliminate the amplifier control. The structure of the matrix that includes such cells is therefore made very much simpler. Additionally, the memory cell read speed is also increased.

The variant shown in FIG. 2 proves to be even more advantageous. This cell 1 also includes a flip-flop 2, switching transistors T3 and T4 and read transistors Ti and T2. The transistor T3 is connected between a bit write line wb1O and the storage terminal $\overline{Q}$. Its gate is connected to a word selection line w12. The transistor T4 is connected between a bit write line wb11 and the terminal Q of the flip-flop 2. Its gate is connected to a word selection line w11. The read transistors T1 and T2 are connected in series. The source of T1 is grounded, the drain of T2 is connected to the bit read line b1r. The transistor TI has its gate connected to the terminal Q. The transistor T2 has its gate connected to the word selection line w11.

The read transistor T1 also reproduces in this variant the state of the terminal Q at its drain. The application of this logic level to the bit line b1r is conditioned by the signal applied by the line w11 in this variant.

It may be noted that the connections of the gates of the transistors T2, T3 and T4 (customarily made of polycrystalline silicon) are simpler to implement than in the example in FIG. 1. In the example in FIG. 2, the gates of the transistors T2 and T4 are shared. A single connection at the upper level is necessary for the gate of the transistors T2 and T4. Conversely, in the example in FIG. 1, the gates of the transistors T2, T3 and T4 are independent and require three connections at the upper level.

Figure 3:
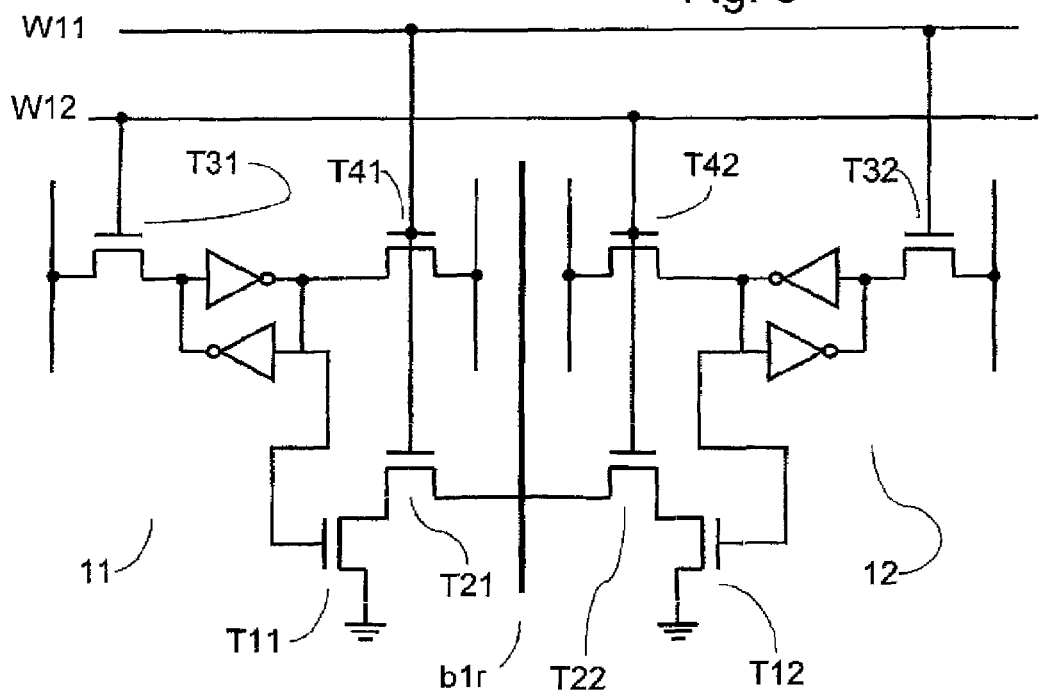
FIG. 3 shows a memory matrix portion including two cells according to the second variant.

Additionally, the memory cell in this variant is to advantage integrated into a memory matrix as shown in FIG. 3. In this example, the matrix portion shown includes two cells 11 and 12 as described with reference to FIG. 2. The cells 11 and 12 use one and the same bit read line b1r. The transistors T31, T42 and T22 have their gate connected to the word selection line w12. The transistors T41, T21 and T32 have their gate connected to the word selection line W11.

Figure 4:
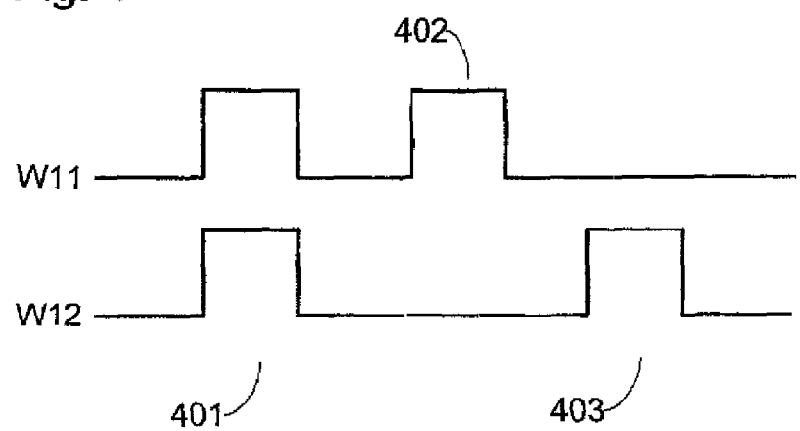
FIG. 4 shows a timing diagram showing a method for controlling a pair of memory cells according to the second variant.

By using an appropriate driver circuit (not shown), a pair of cells of this kind incorporates a multiplexer. The timing diagram in FIG. 4 shows this multiplexing function: at stage 401, the driver circuit applies a switch-on signal simultaneously to the first and second word selection lines w11 and w12. The switches T31, T41, T32 and T42 are then in the on-state. The data applied to the bit write lines is then stored in the cells 11 and 12. At stages 402 and 403, the driver circuit forces the common bit read line b1r to read in sequence the cells 11 and 12: in stage 402, the transistor T21 is put into the on-state and the cell 11 is therefore read on the line b1r. In stage 403, the transistor T22 is put into the on-state and the cell 12 is therefore read on the line b1r in its turn. The cells 11 and 12 thus incorporate a multiplexer. This multiplexer allows the read speed of the memory cells to be increased. Additionally, the size of the multiplexers connected to the matrix is therefore divided by 2. The structure is further simplified by the use of a single bit line for two cells.

The man skilled in the art will be able to take full advantage of these multiplexing possibilities with an increased number of selection lines in order to multiplex a larger number of cells. This parameter will for example be adapted as a function of the height available in the height of the memory point.

The word lines of such a matrix additionally have a reduced capacity, on account of the fact that currently 3 transistors are connected to each word line and not 4.

Figure 5:
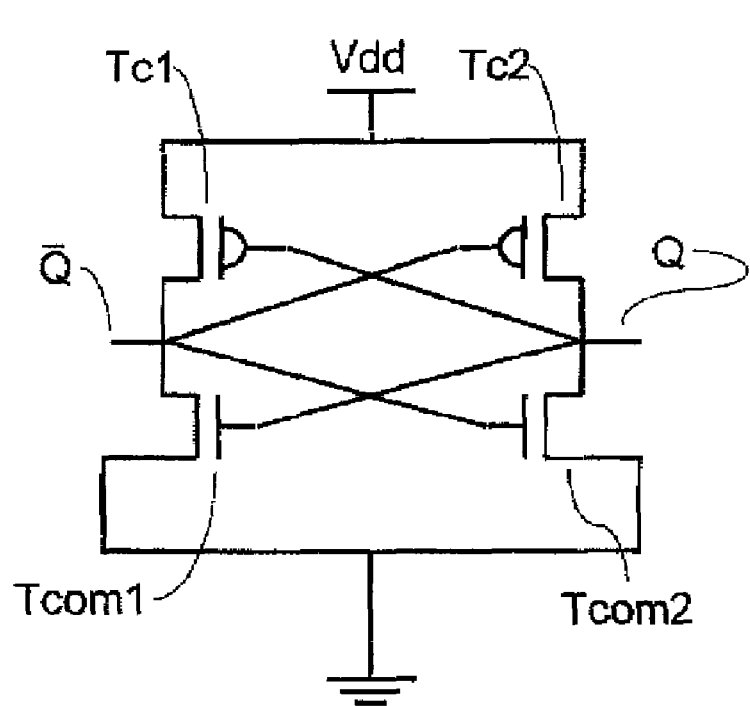
FIG. 5 shows a prior art flip-flop that can be used in a memory cell according to the invention.

The flip-flop 2 is constituted by any appropriate constituent. In particular a flip-flop may be provided fitted with two driver transistors and two load transistors as shown in FIG. 5 or a flip-flop fitted with two driver transistors and in which the transistors Tc1 and Tc2 are replaced by polycrystalline silicon resistors as described on page 2 of the article E2470 in the publication "The Techniques of the Engineer".

While there has been illustrated and described what is presently considered to be embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above.

Therefore, it is intended that the present invention not be limited to the particular embodiments disclosed, but that the invention include all embodiments falling within the scope of the appended claims.

What is claimed is:

1. A memory bit cell, comprising:
   a flip-flop that has additional first and second read/write terminals, the second terminal being different from the first terminal;
   a 1-bit write line;
   a first switching transistor connected between the 1-bit write line and the first terminal and the gate of which is connected to a first word selection line;
   a 0-bit write line being different from the 1-bit write line;

a second switching transistor connected between the 0-bit write line and the second terminal, and the gate of which is connected to a second word selection line different from the first word selection line;

a bit read line; and first and second read transistors connected in series between ground and the bit read line, the gate of the first read transistor being connected to one of the read/write terminals, the gate of the second read transistor being connected to a word selection line; and wherein one of the read transistors and the switching transistor connected to the same read/write terminal have their gate connected to one and the same word selection line.

2. The memory bit cell according to claim 1, wherein the flip-flop includes:

first and second driver transistors connected between ground and the first and second terminals respectively and the gates of which are connected to the second and first terminals respectively; and first and second load transistors connected between the first and second terminals respectively and a power supply, and the gates of which are connected to the second and first terminals respectively.

3. The memory bit cell according to claim 1, wherein the first and second load transistors are of the pMos type, and in that the first and second driver transistors are of the nMos type.

4. A memory matrix, comprising:

first and second memory bit cells sharing one and the same bit read line, wherein each memory bit cell, comprising:

a flip-flop that has additional first and second read/write terminals;

a 1-bit write line;

a first switching transistor connected between the 1-bit write line and the first terminal and the gate of which is connected to a first word selection line;

a 0-bit write line;

a second switching transistor connected between the 0-bit write line and the second terminal, and the gate of which is connected to a second word selection line different from the first word selection line;

a bit read line; and first and second read transistors connected in series between ground and the bit read line, the gate of the first read transistor being connected to one of the read/write terminals, the gate of the second read transistor being connected to a word selection line; and wherein one of the read transistors and the switching transistor connected to the same read/write terminal have their gate connected to one and the same word selection line; and a first word selection line connected to the gate of the first switching transistor of the second cell and to the gate of the second read transistor of the first cell; and a second word selection line connected to the gate of the first switching transistor of the first cell and to the gate of the second read transistor of the second cell.

5. The memory matrix according to claim 4, wherein the bit read line is not connected to a measurement amplifier.

6. The memory matrix according to claim 4, further comprising a driver circuit, simultaneously applying a switch-on signal to the first and second word selection lines during a write stage in the cells, and applying a switch-on signal to only one of the two word selection lines during a cell read stage.

7. The memory matrix according to claim 6, wherein the driver circuit implements a read stage of one of the first cell and the second cell.

8. The memory matrix according to claim 6, wherein the bit read line is not connected to a measurement amplifier.

9. The memory matrix according to claim 6, wherein the driver circuit applies write signals to the bit write lines during a write stage and does not apply write signals to the bit write lines during a read stage.

10. The memory matrix according to claim 9, wherein the bit read line is not connected to a measurement amplifier.

11. The memory matrix according to claim 9, wherein the driver circuit implements a read stage of one of the first cell and the second cell.

12. The matrix according to claim 11, wherein the bit read line is not connected to a measurement amplifier.

* * * * *